(12) United States Patent
Yu et al.

(10) Patent No.: US 8,803,189 B2
(45) Date of Patent: Aug. 12, 2014

(54) III-V COMPOUND SEMICONDUCTOR EPITAXY USING LATERAL OVERGROWTH

(75) Inventors: Chen-Hua Yu, Hsin-Chu (TW); Chia-Lin Yu, Tainan (TW); Ding-Yuan Chen, Taichung (TW); Wen-Chih Chiou, Miaoli (TW); Hung-Ta Lin, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 449 days.

(21) Appl. No.: 12/538,701

(22) Filed: Aug. 10, 2009

(65) Prior Publication Data

US 2010/0044719 A1  Feb. 25, 2010

Related U.S. Application Data

(60) Provisional application No. 61/087,921, filed on Aug. 11, 2008.

(51) Int. Cl.
*H01L 33/00* (2010.01)

(52) U.S. Cl.
USPC ............ 257/103; 257/E21.127; 257/E21.566; 438/41; 438/44; 438/481

(58) Field of Classification Search
USPC .................................................. 257/E21.127
See application file for complete search history.

(56) References Cited

U.S. PATENT DOCUMENTS

| | | | |
|---|---|---|---|
| 6,312,967 B1 * | 11/2001 | Ikeda | 438/22 |
| 6,939,733 B2 | 9/2005 | Shibata et al. | |
| 6,955,977 B2 | 10/2005 | Kong et al. | |
| 7,128,786 B2 | 10/2006 | Jurgensen et al. | |
| 7,338,828 B2 | 3/2008 | Imer et al. | |
| 2002/0022287 A1 | 2/2002 | Linthicum et al. | |
| 2002/0046693 A1 | 4/2002 | Kiyoku et al. | |
| 2002/0069816 A1 | 6/2002 | Gehrke et al. | |
| 2002/0187356 A1 | 12/2002 | Weeks, Jr. et al. | |
| 2003/0006409 A1 * | 1/2003 | Ohba | 257/18 |
| 2003/0092230 A1 | 5/2003 | Koike et al. | |
| 2003/0111008 A1 | 6/2003 | Strittmatter et al. | |
| 2003/0141512 A1 * | 7/2003 | Bruderl et al. | 257/99 |
| 2003/0162340 A1 | 8/2003 | Tezen | |
| 2005/0003572 A1 * | 1/2005 | Hahn et al. | 438/47 |
| 2007/0178676 A1 * | 8/2007 | Oda | 438/502 |
| 2007/0190678 A1 | 8/2007 | Shin | |
| 2008/0210951 A1 * | 9/2008 | Jiang et al. | 257/79 |
| 2008/0308835 A1 * | 12/2008 | Pan | 257/103 |
| 2010/0068866 A1 | 3/2010 | Yu et al. | |

OTHER PUBLICATIONS

Smart, et al., "Single Step Process for Epitaxial Lateral Overgrowth of GaN on SiC and Sapphire Substrates," Applied Physics Letters, Dec. 13, 1999, pp. 3820-3822, vol. 75, No. 24.

(Continued)

*Primary Examiner* — Daniel Whalen
(74) *Attorney, Agent, or Firm* — Slater and Matsil, L.L.P.

(57) ABSTRACT

A circuit structure includes a substrate; a patterned mask layer over the substrate, wherein the patterned mask layer includes a plurality of gaps; and a group-III group-V (III-V) compound semiconductor layer. The III-V compound semiconductor layer includes a first portion over the mask layer and second portions in the gaps, wherein the III-V compound semiconductor layer overlies a buffer/nucleation layer.

30 Claims, 5 Drawing Sheets

(56) References Cited

OTHER PUBLICATIONS

Zheleva, et aL, "Dislocation Density Reduction Via Lateral Epitaxy in Selectively Grown GaN Structures," Applied Physics Letters 71 (17), Oct. 27, 1997, Downloaded Nov. 20, 2009, pp. 2472-2474.

Zheleva, et al., "Thermal Mismatch Stress Relaxation Via Lateral Epitaxy in Selectively Grown GaN Structures," Applied Physics Letters, Apr. 26, 1999, pp. 2492-2494, vol. 74, No. 17.

* cited by examiner

III-V COMPOUND SEMICONDUCTOR EPITAXY USING LATERAL OVERGROWTH

This application claims the benefit of U.S. Provisional Application No. 61/087,921 filed on Aug. 11, 2008, entitled "III-V Compound Semiconductor Epitaxy Using Lateral Overgrowth," which application is hereby incorporated herein by reference.

TECHNICAL FIELD

This invention relates generally to semiconductor circuit manufacturing processes and more particularly to forming group-III group-V (III-V) compound semiconductor films.

BACKGROUND

Group-III group-V compound semiconductors (often referred to as III-V compound semiconductors), such as gallium nitride (GaN) and its related alloys, have been under intense research in recent years due to their promising applications in electronic and optoelectronic devices. Particular examples of potential optoelectronic devices employing III-V compound semiconductors include blue light emitting diodes and laser diodes, and ultra-violet (UV) photo-detectors. The large band gap and high electron saturation velocity of many III-V compound semiconductors also make them excellent candidates for applications in high temperature and high-speed power electronics.

Epitaxially grown films of the III-V compound semiconductor GaN are widely used in the fabrication of light-emitting diodes. Unfortunately GaN epitaxial films must be grown on substrates other than GaN because it is extremely difficult to obtain GaN bulk crystals due to the high equilibrium pressure of nitrogen at the temperatures typically used to grow bulk crystals. Owing to the lack of feasible bulk growth methods for GaN substrates, GaN is commonly deposited epitaxially on dissimilar substrates such as silicon, SiC and sapphire ($Al_2O_3$). However, the growth of GaN films on dissimilar substrates is difficult because those substrates have lattice constants and thermal expansion coefficients different than those of GaN. If the difficulties of growing GaN films on silicon substrates could be overcome, silicon substrates would be attractive for GaN growth given their low cost, large diameter, high crystal and surface quality, controllable electrical conductivity, and high thermal conductivity. The use of silicon substrates would also provide easy integration of GaN based optoelectronic devices with silicon-based electronic devices.

Additionally, due to the lacking of appropriate substrates for growing GaN films thereon, the sizes of the GaN films are limited. The large stresses created by growing a GaN film on a dissimilar substrate may cause the substrate to bow. This bowing may cause several adverse effects. First, a great number of defects (dislocations) will be generated in the supposedly crystalline GaN films. Second, the thicknesses of the resulting GaN films will be less uniform; causing wavelength shifts of the light emitted by the optical devices formed on the GaN films. Third, cracks may be generated in large stressed GaN films.

The epitaxial lateral overgrowth (ELOG) technique has been used to form GaN films on dissimilar substrates in order to reduce stress and the number of dislocations in the film. FIGS. 1 and 2 illustrate a conventional ELOG process. Referring to FIG. 1, substrate 10 is provided. Under-layer 12, which comprises a nitride semiconductor (i.e., a III-V compound semiconductor in which the group V element is nitrogen), such as GaN, is formed on substrate 10. Dielectric masks 14 are then formed on under-layer 12. Next, a III-V compound semiconductor layer 16 is epitaxially grown, wherein the growth includes a vertical growth component and a lateral overgrowth component, which eventually results in a continuous III-V compound layer 16. In FIG. 2, an additional mask layer 18 is formed, followed by the growth of III-V compound layer 19. Again, the growth includes a vertical growth and a lateral growth, so that III-V compound layer 19 eventually becomes a continuous layer.

The III-V compound semiconductor film formation method shown in FIGS. 1 and 2 suffers from drawbacks. First, in the case substrate 10 comprises silicon, the silicon in the substrate may react with the nitrogen in under-layer 12 to form silicon nitride. The undesirably formed silicon nitride acts as an amorphous overcoat at the interface between silicon substrate 10 and under-layer 12. The amorphous overcoat adversely affects the film quality of the subsequently grown III-V compound semiconductor films. In addition, silicon nitride has a high resistivity, and hence prevents the formation of vertical optoelectronic devices, in which two contacts to the optoelectronic device are formed on opposite sides of substrate 10. New methods for forming III-V compound semiconductor films while overcoming the above-discussed drawbacks are thus needed.

SUMMARY OF THE INVENTION

In accordance with one aspect of the present invention, a circuit structure comprises a substrate; a patterned mask layer over and in direct contact with the substrate, the patterned mask layer comprising a plurality of gaps; a buffer/nucleation layer disposed over the substrate and within the gaps in the patterned mask layer; and a group-III group-V (III-V) compound semiconductor layer disposed within the gaps in the patterned mask layer and over the buffer/nucleation layer, and further extending above the gaps to form a continuous layer over the patterned mask layer and the gaps in the patterned mask layer. The circuit structure may further comprise an intermediate layer underlying the buffer/nucleation layer within the gaps. Either of the above circuit structures may further comprise additional patterned mask layers and III-V semiconductor layers.

In accordance with another aspect of the present invention, a circuit structure comprises a substrate; an intermediate layer disposed on the substrate; a buffer/nucleation layer disposed over the intermediate layer; a group-III group-V (III-V) compound semiconductor underlayer disposed on the buffer/nucleation layer; a patterned mask layer over the III-V compound semiconductor underlayer, the patterned mask layer comprising a plurality of gaps; and a III-V compound semiconductor layer disposed within the gaps in the patterned mask layer, and further extending above the gaps to form a continuous layer over the patterned mask layer and the gaps in the patterned mask layer. The circuit structure may further comprise additional patterned mask layers and III-V semiconductor layers.

In accordance with yet another aspect of the present invention, a circuit structure comprises a substrate comprising an upper portion and a lower portion; an intermediate layer disposed on the upper portion of the substrate; a patterned mask layer over and directly contacting the intermediate layer, the patterned mask layer comprising a plurality of gaps; a buffer/nucleation layer disposed over the intermediate layer and within the gaps in the patterned mask layer; and a group-III group-V (III-V) compound semiconductor layer disposed within the gaps in the patterned mask layer and over the buffer/nucleation layer, and further extending above the gaps to form a continuous layer over the patterned mask layer and the gaps in the patterned mask layer. The circuit structure may further comprise additional patterned mask layers and III-V semiconductor layers.

The advantageous features of the present invention include increased lateral growth in the formation of III-V compound semiconductor materials and reduced intermix between the III-V compound semiconductor materials and the underlying substrates.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention and do not limit the scope of the invention.

A novel method for forming group-III group-V (referred to as III-V hereinafter) semiconductor films and the resulting structures are provided. Throughout the description, the term "III-V compound semiconductor" refers to compound semiconductor materials comprising at least one group III element and one group-V element. The term "III-N compound semiconductor" refers to a III-V compound semiconductor in which the group V element is nitrogen. The required stages of manufacturing an illustrative embodiment of the present invention are illustrated. Those skilled in the art will recognize that other manufacturing steps may need to take place before or after the described stages in order to produce a complete device. Throughout the various views and illustrative embodiments of the present invention, like reference numbers are used to designate like elements.

Figure 3:
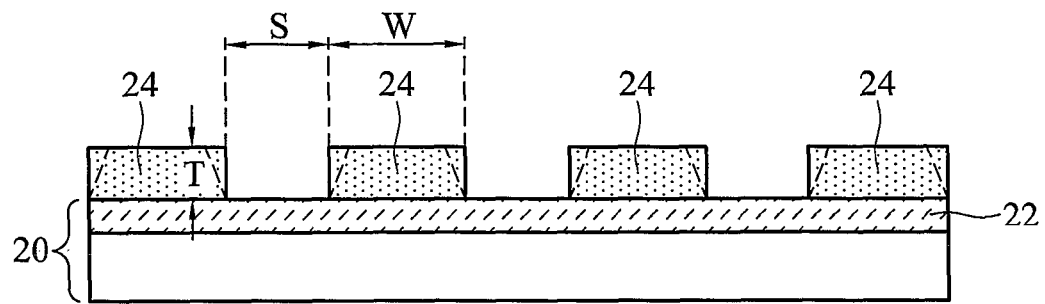
FIGS. 3 through 5 are cross-sectional views of stages in the manufacturing of an embodiment of the present invention, in which a mask layer is formed directly on a substrate.

Referring to FIG. 3, substrate 20 is provided. In an embodiment, substrate 20 is a bulk substrate comprising, for example, semiconductor material(s), such as silicon. Alternatively, substrate 20 may comprise a multilayer structure, such as a semiconductor-on-insulator (SOI) structure, which has buried oxide layer in between two silicon layers. Substrate 20 may also be formed of other commonly used materials, such as sapphire, SiGe, SiC, Ge, ZnO, ZnSe, ZnS, GaP, or GaAs. Substrate 20 is typically subjected to a pre-clean step to remove contamination before any films are deposited on substrate 20. Optionally, carbon is doped into a surface layer of substrate 20, for example, using implantation, diffusion, or epitaxy. As a result, carbon-rich layer 22 is formed within the upper portion of the substrate 20. Advantageously, the carbon-rich layer 22 may prevent the intermixing of materials in the subsequently formed layers with materials in substrate 20. In an embodiment, the carbon concentration of carbon-rich layer 22 is three orders of magnitude (1,000 times) higher than in the lower portion of substrate 20.

Figure 1:
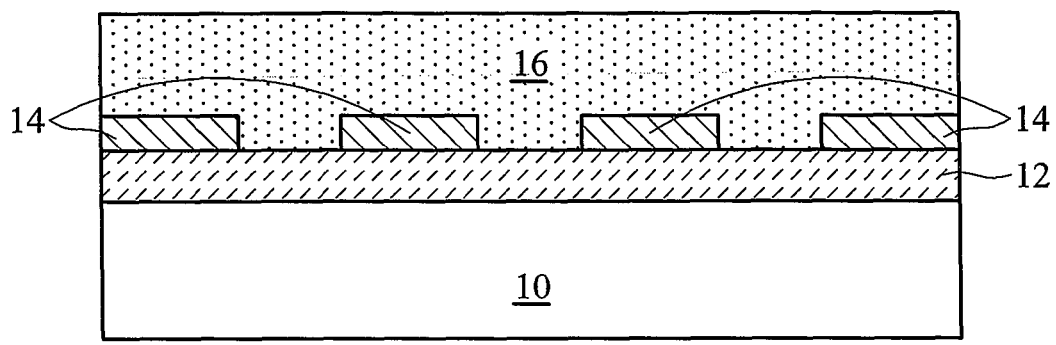
FIGS. 1 and 2 illustrate a conventional process for forming a group-III group-V semiconductor film.
Figure 2:
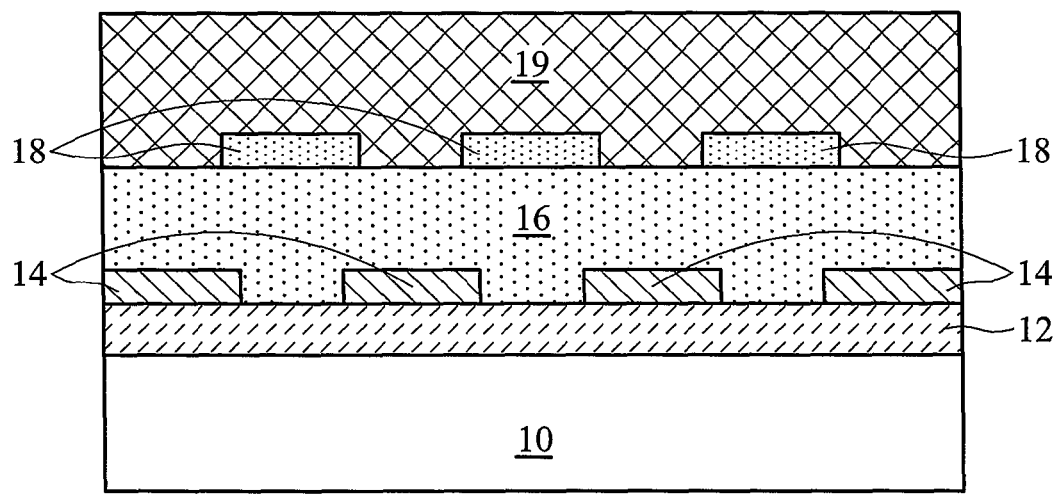

Next, mask layer 24 is formed on substrate 20. Mask layer 24 is in direct contact with substrate 20, which means that there are no material layers interposed between the substrate and mask layer 24. In contrast, masks 14 in FIG. 1 have a layer of III-N compound semiconductor interposed between them and substrate 10. Returning to FIG. 3, mask layer 24 may include a material selected from dielectric materials, such as $SiN_x$ or $SiO_x$ (with x being a positive value, and may be in range $0<x\leq 3$); metals such as W, Mg, Ag, Al, Ti, or Cr; metal alloys such as Ti—Al or Al—Ag; metal nitrides such as TiN or TaN; metal carbides such as TaC or TiC; or metal carbon-nitrides such as TiCN or TaCN. Mask layer 24 may also include multi-layers of the above-discussed materials. The applicable deposition methods for forming mask layer 24 include physical vapor deposition (PVD) and chemical vapor deposition (CVD). In some embodiments it may be advantageous to use conductive materials for mask layer 24, so that mask layer 24 also has the function of conducting carriers in vertical optoelectronic devices, in which the two contacts are formed on opposite sides of substrate 20. This is particularly advantageous if high-resistivity materials are formed between substrate 20 and III-V compound semiconductor layer 30 (not shown in FIG. 3, refer to FIG. 4) within the gaps in mask layer 24.

Mask layer 24 is then patterned so that the surface of substrate 20 is selectively exposed through the gaps between remaining portions of mask layer 24. The patterning may be performed using a dry etch and/or a wet etch. The remaining portions of mask layer 24 may have any shape with controlled width and spacing, and may form parallel strips or other periodic patterns. In other embodiments, the remaining portions of mask layer 24 may be arranged as an array or other periodic patterns, with each remaining portion having a square, a strip, a polygon shape (in a top view). In yet other embodiments, the remaining portions of mask layer 24 may form an interconnected grid structure, with windows therein for exposing the underlying substrate 20. In an exemplary embodiment, the spacing S between mask layer portions 24 is between about 0.05 μm and about 10 μm, while the width W of each of the mask layer portions 24 is about 2 μm. A ratio of width W to spacing S is preferably no more than about 20. The thickness T may be about 2 nm to about 6 μm. One skilled in the art will realize, however, that the dimensions recited throughout the description are merely examples, and will change if different formation technologies are used.

Figure 5:
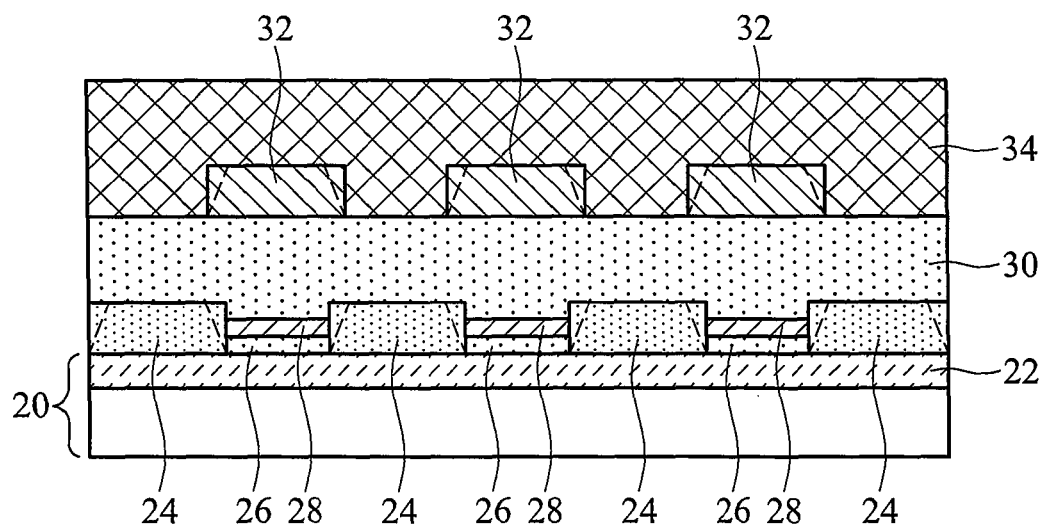

In an embodiment, the remaining portions of mask layer 24 have vertical sidewalls, which may be formed by using dry etch in the patterning of mask layer 24. Alternatively, as shown using dashed lines, the remaining portions of mask layer 24 may have slanted sidewalls, which may be formed by using a combination of a dry etch and wet etch in the patterning of mask layer 24. The remaining portions of patterned mask layer 24 (and the subsequently formed mask layer 32, as shown in FIG. 5) are suitable for the subsequent lateral growth of III-V compound semiconductor materials.

Figure 4:
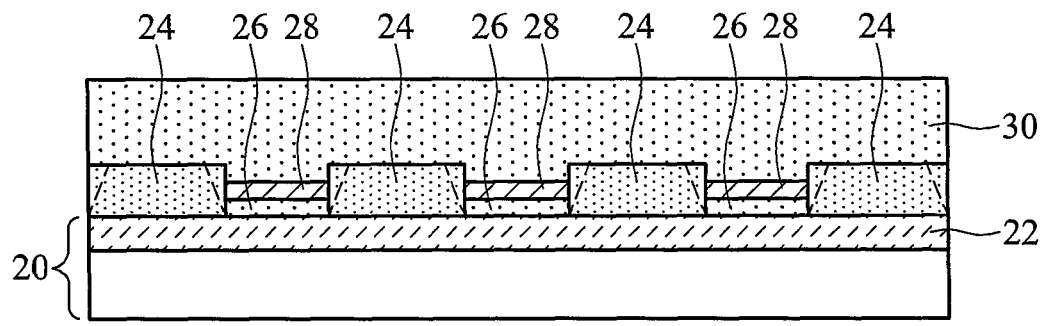

FIG. 4 illustrates the selective formation of optional intermediate layer 26, which is formed only in the gaps between remaining portions of mask layer 24, but not directly on the remaining portions of mask layer 24. In an embodiment, intermediate layer 26 is a pre-seeding layer, which is defined within this disclosure as a layer comprising a metal such as Al, Mg, Ga, In, Zn, and combinations thereof. The pre-seeding layer may be deposited by CVD or PVD. In alternative embodiments, intermediate layer 26 is a transition layer, which is defined within this disclosure as a layer comprising a metal such as Ti or Ag; a metal alloy such as Ti—Al; a metal nitride such as TiN or TaN; a metal-carbide such as TaC or TiC; or a metal carbon-nitride such as TiCN or TaCN. Intermediate layer 26 may also comprise a combination of a pre-seeding layer and a transition layer. The thickness of intermediate layer 26 may be between about 1 nm and about 100 nm.

FIG. 4 also illustrates the selective formation of a buffer/nucleation layer 28. In the embodiment shown in FIG. 4, buffer/nucleation layer 28 is selectively formed only within the gaps between the remaining portions of mask layer 24, but not directly on top of the mask layer 24. Within this disclosure the term buffer/nucleation layer 28 refers to a layer of material selected from the group of a III-V compound semiconductor, such as a III-nitride semiconductor (for example, GaN); a metal nitride, a metal carbide, a metal carbon-nitride, a pure metal, a metal alloy, or a silicon-containing material. Buffer/nucleation layer 28 may comprise essentially the same, or similar materials as the overlying III-V compound semiconductor layer 30, as will be discussed in subsequent paragraphs. In an exemplary embodiment, buffer/nucleation layer 28 is formed using PVD or CVD, at a temperature of about 600° C., for example.

Next, III-V compound semiconductor layer 30 is grown starting from buffer/nucleation layer 28 using epitaxial layer overgrowth (ELOG). III-V compound semiconductor layer 30 may be formed at a temperature higher than the formation temperature of buffer/nucleation layer 28, hence forming a crystalline structure as compared to the more amorphous structure in buffer/nucleation layer 28. In an embodiment, III-V compound semiconductor layer 30 is a III-N compound semiconductor layer including a material selected from GaN, InN, AlN, $In_xGa_{(1-x)}N$, $Al_xGa_{(1-x)}N$, $Al_xIn_{(1-x)}N$, $Al_xIn_yGa_{(1-x-y)}N$, and combinations thereof. The formation methods include metal organic CVD (MOCVD), metal organic vapor phase epitaxy (MOVPE), plasma enhanced CVD (PECVD), remote plasma enhanced CVD (RP-CVD), molecular beam epitaxy (MBE), hydride vapor phase epitaxy (HVPE), chloride vapor-phase epitaxy (Cl-VPE), and liquid phase epitaxy (LPE). As III-V compound semiconductor layer 30 is grown, it is first deposited over buffer/nucleation layer 28 within the gaps, and then the growth process continues until the layer emerges from the gaps and coalesces over mask layer 24 to form a continuous overgrown layer. Advantageously, after the top surface of III-V compound semiconductor layer 30 is grown to a level higher than mask layer 24, it grows both vertically and laterally, and the lateral overgrowth may advantageously reduce the number of dislocations in the crystalline structure.

Referring to FIG. 5, additional mask layer 32 and III-V compound semiconductor layer 34 are formed. Additional mask layer 32 may be comprise a material selected from the same set of materials previously described as being suitable for mask layer 24, and the deposition method for that material may be selected from one of the deposition methods previously described for mask layer 24. Similarly, additional III-V compound semiconductor layer 34 may be formed using the same materials and methods previously described for semiconductor layer 30. Preferably, portions of additional mask layer 32 are directly over the gaps in mask layer 24 and may substantially cover the gaps. Accordingly, mask layer 32 may have discrete portions (such as strips) or form a connected pattern with windows (spacings) therein. Similarly to semiconductor layer 30, additional semiconductor layer 34 is grown both vertically and laterally, wherein the lateral component eventually causes continuous III-V compound semiconductor layer 34 to be formed. Advantageously, by placing the remaining portions of mask layer 32 directly over the gaps in mask layer 24, the vertical growth of the III-V compound semiconductor layer 30 may be converted into the lateral growth in III-V compound semiconductor layer 34, and the number of dislocations in III-V compound semiconductor layer 34 may be further reduced.

After the formation of additional III-V compound semiconductor layer 34, which may be doped or undoped, an optoelectronic device (not shown) may be formed. The optoelectronic device may include at least one of the following structures: a P-N junction, a homojunction, heterojunction, a single-quantum well (SQW), or a multi-quantum well (MQW) (not shown). One skilled in the art will realize the respective structures. The respective optoelectronic device may be a light-emitting diode (LED) or a photo diode.

Figure 6:
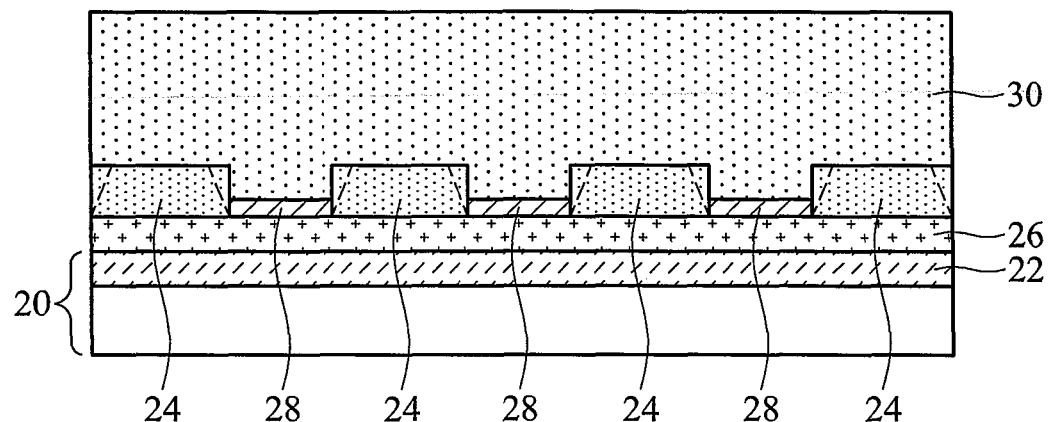
FIGS. 6 and 7 are cross-sectional views of stages in the manufacturing of yet another embodiment of the present invention, in which a pre-seeding layer or a transition layer separates the substrate and the overlying III-V materials.
Figure 7:
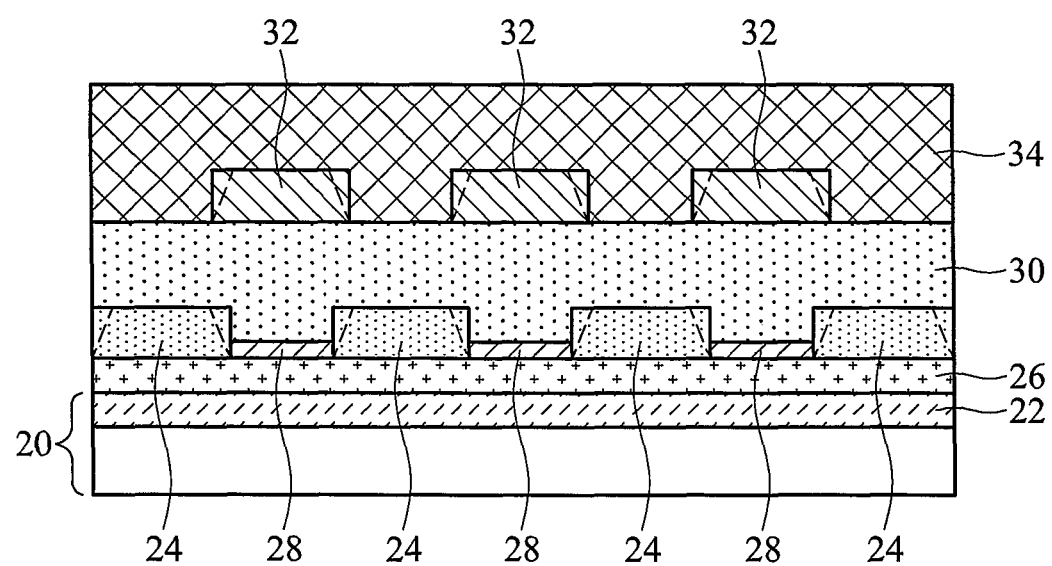

FIGS. 6 through 9 illustrate alternative embodiments of the present invention. In the embodiments discussed in subsequent paragraphs, unless specifically discussed, like elements are referred to using like reference numerals as discussed in the preceding paragraphs. Similarly, the materials forming the various layers and the methods for depositing those various layers are the same as previously described for the corresponding layers in the embodiment of FIGS. 3 through 5. FIGS. 6 and 7 illustrate a second embodiment of the present invention. Referring to FIG. 6, instead of forming mask layer 24 directly on substrate 20, intermediate layer 26, which may be a pre-seeding layer or a transition layer, is blanket formed on substrate 20. Mask layer 24 is then formed and patterned directly over intermediate layer 26. In other words, there are no layers interposed between mask layer 24 and intermediate layer 26. As in the embodiment of FIGS. 3 through 5, buffer/nucleation layer 28 is formed within the gaps in mask layer 24, followed by the formation of III-V compound semiconductor layer 30.

Referring to FIG. 7, additional mask layer 32 and additional III-V compound semiconductor layer 34 are formed. Again, the portions of mask layers 24 and 32 may have vertical edges, as shown by solid lines, or slanted edges, as shown by dashed lines.

Figure 8:
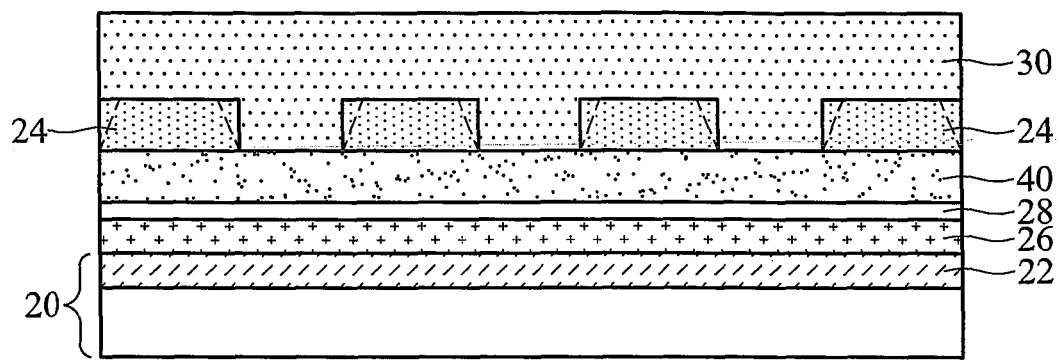
FIGS. 8 and 9 are cross-sectional views of stages in the manufacturing of yet another embodiment of the present invention, in which a III-V compound semiconductor layer and an intermediate layer (a pre-seeding layer or a transition layer) separate the substrate and the overlying III-V materials.
Figure 9:
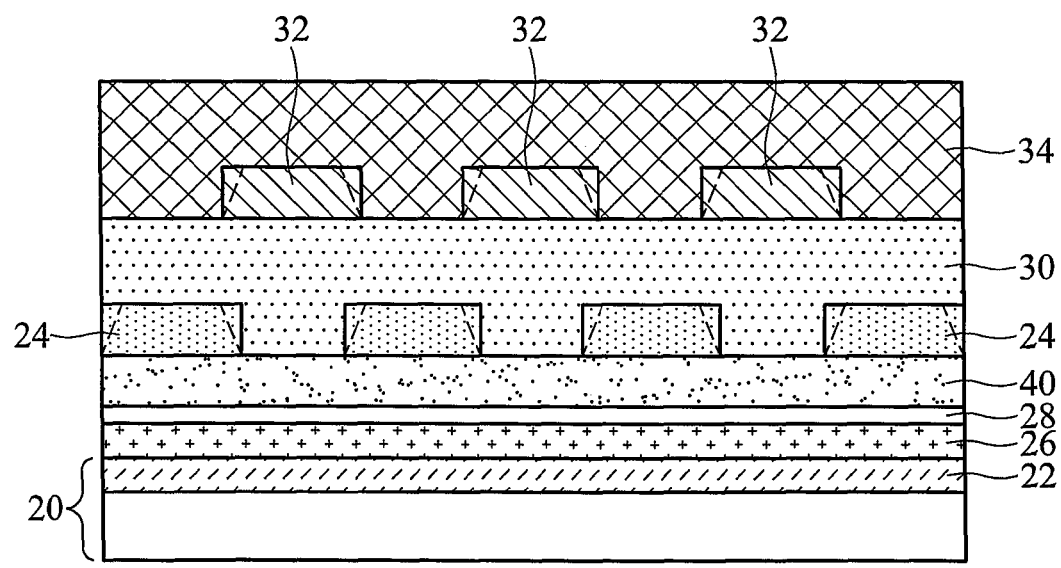

FIGS. 8 and 9 illustrate yet another embodiment of the present invention. In the embodiment of FIG. 8 intermediate layer 26 is blanket formed on substrate 20. Buffer/nucleation layer 28 is then blanket formed on intermediate layer 26, followed by the formation of III-V compound semiconductor under-layer 40. Mask layer 24 is then formed on III-V compound semiconductor under-layer 40 and then patterned. III-V compound semiconductor layer 30 is then formed as previously described.

Again, FIG. 9 illustrates the formation of additional mask layer 32 and additional III-V compound semiconductor layer 34. The remaining portions of mask layers 24 and 32 may have vertical edges, as shown by solid lines, or slanted edges, as shown by dashed lines.

Figure 10:
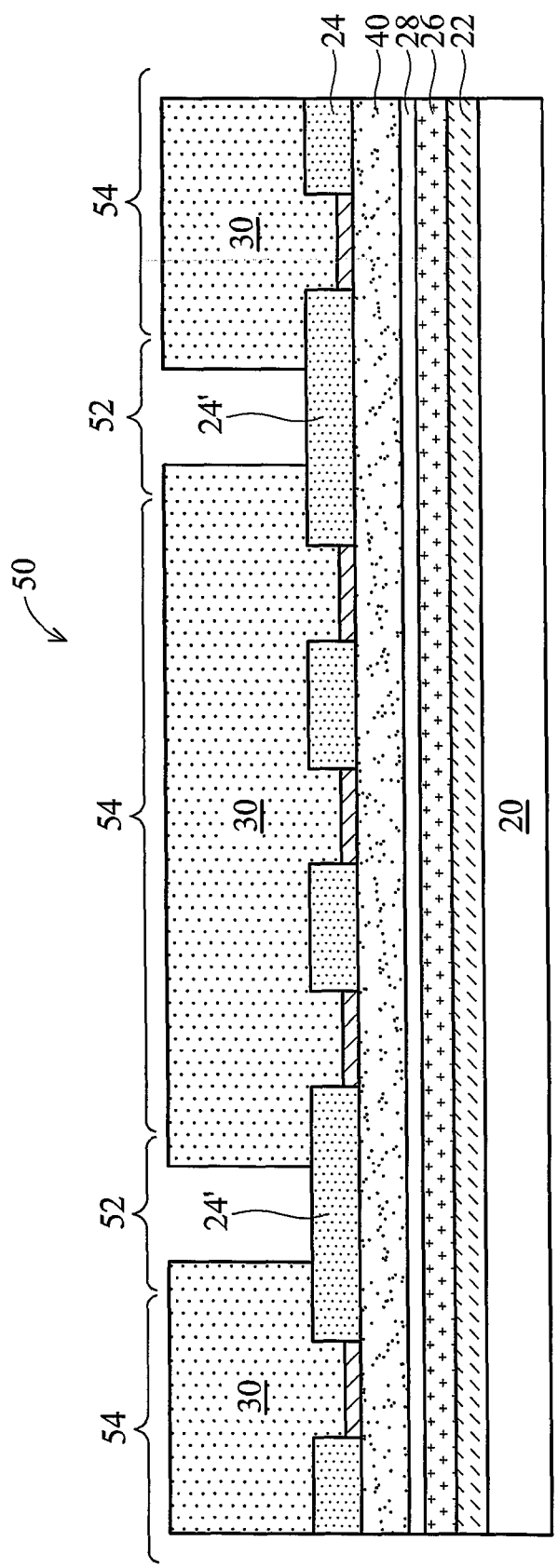
FIG. 10 illustrates a portion of a wafer including a III-V compound semiconductor film formed by lateral overgrowth, wherein portions of the III-V compound semiconductor layer grown from the chips on opposite sides of a scribe line do not join each other by the lateral growth.

In the above-discussed embodiments, III-V compound semiconductor layers 30 and 34 may extend substantially throughout an entire chip, and even an entire wafer. FIG. 10 illustrates a portion of wafer 50, which includes chips 54, and scribe lines 52 separating chips 54. Mask layer 24 preferably has portions 24' extending into scribe lines 52. In an embodiment of the present invention, mask layer portions 24' are wide enough so that portions of III-V compound semiconductor layer 30 grown from chips 54 on opposite sides of scribe lines 52 do not join each other by the lateral growth. This may help reduce the stress effect during the chip dicing.

The embodiments of the present invention may have other variations. For example, the formation of additional mask layer 32 and the additional III-V compound semiconductor layer 34 may be omitted. Alternatively, after the formation of additional mask layer 32 and additional III-V compound semiconductor layer 34, more mask layers and III-V compound semiconductor layers may be formed to further improve the quality of the resulting III-V compound semiconductor layers.

The embodiments of the present invention have several advantageous features. By separating silicon substrate 20 from the elements that may react with substrate 20, for example, nitrogen, the adverse amorphous structure that may otherwise affect the crystalline growth of III-V compound semiconductor material is eliminated. The lateral growth of III-V compound semiconductor layers 30 and 34 results in the generation of fewer dislocations, hence improving the quality of the III-V compound semiconductor layers.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A circuit structure comprising:
a substrate comprising an upper portion and a lower portion;
a patterned mask layer over and in direct contact with the upper portion of the substrate, the patterned mask layer comprising a plurality of gaps;
a buffer/nucleation layer disposed over the substrate and within the gaps in the patterned mask layer, wherein the buffer/nucleation layer comprises a silicon-containing material;
an intermediate layer disposed below the buffer/nucleation layer within the gaps in the patterned mask layer, the intermediate layer consisting essentially of a metal, a metal-alloy, a metal-carbide, or a metal carbon-nitride; and
a group-III group-V (III-V) compound semiconductor layer disposed within the gaps in the patterned mask layer and over the buffer/nucleation layer, and further extending above the gaps to form a continuous layer over the patterned mask layer and the gaps in the patterned mask layer.

2. The circuit structure of claim 1, wherein the intermediate layer is a pre-seeding layer consisting essentially of the metal.

3. The circuit structure of claim 2, wherein the pre-seeding layer consists essentially of aluminum, magnesium, gallium, indium, zinc, or a combination thereof.

4. The circuit structure of claim 1, wherein the intermediate layer is a transition layer.

5. The circuit structure of claim 4, wherein the transition layer consists essentially of Ag or Ti.

6. The structure of claim 4, wherein the transition layer consists essentially of Ti—Al, TaC, TiC, TiCN, or TaCN.

7. The circuit structure of claim 1, wherein the III-V compound semiconductor layer comprises a III-N compound semiconductor.

8. The circuit structure of claim 7, wherein the III-N compound semiconductor comprises GaN.

9. The circuit structure of claim 7, wherein the III-N compound semiconductor comprises GaN, InN, AlN, $In_xGa_{(1-x)}N$, $Al_xGa_{(1-x)}N$, $Al_xIn_{(1-x)}N$, or $Al_xIn_yGa_{(1-x-y)}N$.

10. The circuit structure of claim 1, wherein the patterned mask layer comprises a dielectric material.

11. The circuit structure of claim 10, wherein the patterned mask layer comprises $SiN_x$ or $SiO_x$, wherein x is a positive value.

12. The circuit structure of claim 1, wherein the patterned mask layer is conductive.

13. The circuit structure of claim 12, wherein the patterned mask layer comprises a metal or metal alloy.

14. The circuit structure of claim 1 further comprising:
an additional patterned mask layer disposed over the III-V compound semiconductor layer, the additional mask layer comprising a plurality of gaps; and
an additional group-III group-V (III-V) compound semiconductor layer disposed within the gaps in the additional patterned mask layer, and further extending above the gaps in the additional patterned mask layer to form a continuous layer over the additional patterned mask layer and the gaps in the additional patterned mask layer.

15. The circuit structure of claim 14, wherein the III-V compound semiconductor layer and the additional III-V compound semiconductor layer comprise different materials.

16. The circuit structure of claim 1, wherein the patterned mask layer has vertical sidewalls.

17. The circuit structure of claim 1, wherein the patterned mask layer has slanted sidewalls.

18. The circuit structure of claim 1, wherein the substrate is a bulk semiconductor substrate, the bulk semiconductor substrate comprising the lower portion and the upper portion of the substrate, the upper portion of the substrate comprising carbon, a concentration of the carbon in the upper portion being greater than a carbon concentration in the lower portion.

19. The circuit structure of claim 1, wherein the patterned mask layer comprises tungsten, magnesium, silver, titanium, chromium, or a combination thereof.

20. The circuit structure of claim 1, wherein the patterned mask layer comprises a metal nitride, a metal carbide, a metal carbon-nitride, or a combination thereof.

21. A circuit structure comprising:
a substrate;
a mask layer over the substrate, the mask layer having openings exposing the substrate;

a buffer/nucleation layer over a top surface of the substrate and in the openings, wherein the buffer/nucleation layer comprises a silicon-containing material;

an intermediate layer disposed below the buffer/nucleation layer within the openings of the mask layer, the intermediate layer consisting essentially of a metal, a metal-alloy, a metal-carbide, or a metal carbon-nitride; and a group-III group-V (III-V) compound semiconductor layer in the openings of the mask layer and over the buffer/nucleation layer, and further extending above the mask layer to form a continuous layer over the mask layer.

22. The circuit structure of claim 21, wherein the intermediate layer is a pre-seeding layer.

23. The circuit structure of claim 21, wherein the intermediate layer is a transition layer.

24. The circuit structure of claim 21, wherein the mask layer is conductive.

25. The circuit structure of claim 24, wherein the mask layer comprises a metal or metal alloy.

26. The circuit structure of claim 21 further comprising:
an additional mask layer disposed over the III-V compound semiconductor layer, the additional mask layer comprising additional openings; and
an additional group-III group-V (III-V) compound semiconductor layer in the openings of the additional mask layer, and further extending above the additional mask layer to form a continuous layer over the additional mask layer.

27. The circuit structure of claim 26, wherein the III-V compound semiconductor layer and the additional III-V compound semiconductor layer comprise different materials.

28. The circuit structure of claim 21, wherein the mask layer has vertical sidewalls.

29. The circuit structure of claim 21, wherein the mask layer has slanted sidewalls.

30. The circuit structure of claim 21, wherein the substrate is a bulk semiconductor substrate, the bulk semiconductor substrate comprising carbon at a top surface, a concentration of the carbon at the top surface being greater than a concentration of carbon at a depth of the bulk semiconductor substrate.

* * * * *